(12) United States Patent
Hubacek

(10) Patent No.: US 6,451,157 B1
(45) Date of Patent: *Sep. 17, 2002

(54) GAS DISTRIBUTION APPARATUS FOR SEMICONDUCTOR PROCESSING

(75) Inventor: Jerome Hubacek, Fremont, CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/401,307

(22) Filed: Sep. 23, 1999

(51) Int. Cl.$^7$ ................................................ H05H 1/00
(52) U.S. Cl. ........................................ 156/345; 438/706
(58) Field of Search ...................... 118/723 I, 723 E, 118/723 K, 715; 156/345; 438/706

(56) References Cited

U.S. PATENT DOCUMENTS

| | | | |
|---|---|---|---|
| 3,887,723 A | * 6/1975 | Kaplan et al. ................ 427/58 |
| 4,209,357 A | 6/1980 | Gorin et al. ................. 156/643 |
| 4,263,088 A | 4/1981 | Gorin .......................... 156/626 |
| 4,270,999 A | 6/1981 | Hassan et al. .......... 204/192 E |
| 4,297,162 A | 10/1981 | Mundt et al. ............... 156/643 |
| 4,534,816 A | * 8/1985 | Chen et al. .................. 156/345 |
| 4,579,618 A | 4/1986 | Celestino et al. ........... 156/345 |
| 4,590,042 A | 5/1986 | Drage .................... 422/186.06 |
| 4,595,484 A | 6/1986 | Giammarco et al. ........ 204/298 |
| 4,612,077 A | 9/1986 | Tracy et al. ................. 156/345 |
| 4,780,169 A | 10/1988 | Stark et al. ................. 156/345 |
| 4,826,585 A | 5/1989 | Davis .......................... 204/298 |
| 4,854,263 A | 8/1989 | Chang et al. ............... 118/715 |
| 5,006,220 A | 4/1991 | Hijikata et al. ......... 204/298.33 |
| 5,013,398 A | 5/1991 | Long et al. ................. 156/643 |
| 5,022,979 A | 6/1991 | Hijikata et al. ......... 204/298.33 |
| 5,074,456 A | 12/1991 | Degner et al. .............. 228/121 |
| 5,134,965 A | 8/1992 | Tokuda et al. .............. 118/723 |
| 5,472,565 A | 12/1995 | Mundt et al. ................. 216/71 |
| 5,494,713 A | 2/1996 | Ootuki ........................ 427/579 |
| 5,529,657 A | 6/1996 | Ishii ........................... 156/345 |
| 5,534,751 A | 7/1996 | Lenz et al. ............... 315/111.71 |

(List continued on next page.)

FOREIGN PATENT DOCUMENTS

| | | |
|---|---|---|
| EP | 0708478 A1 | 4/1996 |
| EP | 0779645 A2 | 6/1997 |
| EP | 0826646 A1 | 3/1998 |
| EP | 0843348 A2 | 5/1998 |
| WO | WO954908 | 10/1999 |

*Primary Examiner*—Benjamin L. Utech
*Assistant Examiner*—Lan Vinh
(74) *Attorney, Agent, or Firm*—Burns, Doane, Swecker & Mathis, LLP

(57) ABSTRACT

A baffle plate of a showerhead gas distribution system and method of using the baffle plate wherein the baffle plate is effective for reducing particle and/or metal contamination during processing of semiconductor substrates such as silicon wafers. The showerhead can be a showerhead electrode of a plasma processing chamber such as an etch reactor. The baffle plate comprises silicon on at least one surface thereof and is adapted to fit in a baffle chamber of the gas distribution system such that the silicon containing surface is adjacent to and faces the showerhead. The silicon containing baffle plate can consist entirely of silicon or silicon carbide of at least 99.999% purity. The silicon can be single crystal silicon or polycrystalline and the silicon carbide can be CVD silicon carbide, sintered silicon carbide, non-sintered silicon carbide or combination thereof. The non-sintered silicon carbide can be silicon carbide formed by reaction synthesis of silicon vapor with a carbon material such as graphite. Openings in the silicon containing baffle plate can be offset from openings in the showerhead to avoid a line-of-sight between plasma in the chamber and the openings in the silicon containing baffle plate.

20 Claims, 1 Drawing Sheet

U.S. PATENT DOCUMENTS

| | | | |
|---|---|---|---|
| 5,569,356 A | * 10/1996 | Lenz et al. | 156/345 |
| 5,591,269 A | * 1/1997 | Arami et al. | 118/723 |
| 5,593,540 A | 1/1997 | Tomita et al. | 156/643.1 |
| 5,595,627 A | 1/1997 | Inazawa et al. | 156/643.1 |
| 5,614,055 A | 3/1997 | Fairbairn et al. | 156/345 |
| 5,716,485 A | 2/1998 | Salimian et al. | 156/345 |
| 5,736,457 A | 4/1998 | Zhao | 438/624 |
| 5,746,875 A | 5/1998 | Maydan et al. | 156/345 |
| 5,820,723 A | 10/1998 | Benjamin et al. | 156/345 |
| 5,824,365 A | 10/1998 | Sandhu et al. | 427/239 |
| 5,888,907 A | 3/1999 | Tomoyasu et al. | 438/714 |
| 5,919,332 A | 7/1999 | Koshiishi et al. | 156/345 |
| 6,129,808 A | * 10/2000 | Wicker et al. | 156/345 |

* cited by examiner

GAS DISTRIBUTION APPARATUS FOR SEMICONDUCTOR PROCESSING

FIELD OF THE INVENTION

The present invention relates to reaction chambers used for processing semiconductor substrates, such as integrated circuit wafers, and specifically to improvements in the gas distribution system used in these reaction chambers.

BACKGROUND OF THE INVENTION

Semiconductor processing includes deposition processes such as chemical vapor deposition (CVD) of metal, dielectric and semiconducting materials, etching of such layers, ashing of photoresist masking layers, etc. In the case of etching, plasma etching is conventionally used to etch metal, dielectric and semiconducting materials. A parallel plate plasma reactor typically includes a gas chamber including one or more baffles, a showerhead electrode through which etching gas passes, a pedestal supporting the silicon wafer on a bottom electrode, an RF power source, and a gas injection source for supplying gas to the gas chamber. Gas is ionized by the electrode to form plasma and the plasma etches the wafer supported below the showerhead electrode.

Showerhead electrodes for plasma processing of semiconductor substrates are disclosed in commonly assigned U.S. Pat. Nos. 5,074,456; 5,472,565; 5,534,751; and 5,569,356. Other showerhead electrode gas distribution systems are disclosed in U.S. Pat. Nos. 4,209,357; 4,263,088; 4,270,999; 4,297,162; 4,534,816; 4,579,618; 4,590,042; 4,593,540; 4,612,077; 4,780,169; 4,854,263; 5,006,220; 5,134,965; 5,494,713; 5,529,657; 5,593,540; 5,595,627; 5,614,055; 5,716,485; 5,746,875 and 5,888,907. Of these, the '816 patent discloses a single wafer plasma etching chamber wherein the upper electrode assembly includes an electrode of stainless steel, aluminum or copper and a baffle of conductive material or sintered graphite.

A common requirement in integrated circuit fabrication is the etching of openings such as contacts and vias in dielectric materials. The dielectric materials include doped silicon oxide such as fluorinated silicon oxide (FSG), undoped silicon oxide such as silicon dioxide, silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal silicides such as titanium silicide, cobalt silicide, tungsten silicide, molybdenum silicide, etc. A plasma etching technique, wherein a parallel plate plasma reactor is used for etching openings in silicon oxide, is disclosed in U.S. Pat. No. 5,013,398.

U.S. Pat. No. 5,736,457 describes single and dual "damascene" metallization processes. In the "single damascene" approach, vias and conductors are formed in separate steps wherein a metallization pattern for either conductors or vias is etched into a dielectric layer, a metal layer is filled into the etched grooves or via holes in the dielectric layer, and the excess metal is removed by chemical mechanical planarization (CMP) or by an etch back process. In the "dual damascene" approach, the metallization patterns for the vias and conductors are etched in a dielectric layer and the etched grooves and via openings are filled with metal in a single metal filling and excess metal removal process.

There is a need in the art of semiconductor processing for improved reactor designs wherein contamination due to metals and/or particles is reduced and the time between wet cleans is increased to improved wafer production efficiency. Although efforts have been made to improve reactor designs, any improvements which achieve the abovementioned goals are highly desirable, particularly in the field of oxide etching.

SUMMARY OF THE INVENTION

The invention provides a baffle plate which reduces particle and/or metal contamination during processing of a semiconductor substrate. The baffle plate is adapted to fit within the baffle chamber of a showerhead gas distribution system 5 such that a silicon containing surface of the baffle plate is adjacent to and facing the showerhead. The baffle plate can consist essentially of silicon or a silicon compound such as silicon carbide. A preferred baffle plate material is silicon carbide having a purity of at least 99.999% and/or a porosity of 10 to 30%. The silicon carbide baffle plate can be made entirely of non-sintered silicon carbide, sintered silicon carbide, bulk CVD silicon carbide, sintered silicon carbide with a CVD coating of silicon carbide, graphite coated with silicon carbide, reaction synthesized silicon carbide, or combination thereof.

According to one aspect of the invention, the silicon containing baffle plate can be used as a drop-in replacement for an aluminum baffle plate. When mounted in a baffle chamber, the silicon containing baffle plate can include openings therethrough for passage of process gas, wherein the openings are offset from openings in the showerhead. In order to provide a plenum between the silicon containing baffle plate and an adjacent aluminum baffle plate, the silicon containing baffle plate can include a rim extending around the periphery thereof.

In use, the silicon containing baffle plate can be part of a gas distribution system of a plasma processing chamber wherein the gas distribution system includes a showerhead electrode and the silicon containing baffle plate is mounted in a baffle chamber such that the silicon containing surface faces the showerhead electrode and an opposite side of the silicon containing baffle plate faces an aluminum baffle plate. In such an arrangement, the silicon containing baffle plate is effective to reduce metal contamination by at least an order of magnitude during plasma processing of a semiconductor substrate in the chamber compared to the metal contamination produced under the same processing conditions but using an aluminum baffle plate in place of the silicon containing baffle plate.

The invention also provides a method of reducing particle and/or metal contamination during processing of a substrate in a reaction chamber wherein a gas distribution system includes a showerhead, a baffle chamber through which process gas passes to the showerhead, and a silicon containing baffle plate located in the baffle chamber, the method comprising supplying a semiconductor substrate to the reaction chamber, supplying process gas into the baffle chamber, the process gas passing through the silicon containing baffle plate into a space between the silicon containing baffle plate and the showerhead followed by passing through the showerhead and into an interior of the reaction chamber, and processing the semiconductor substrate with the process gas passing through the showerhead.

According to a preferred method, the showerhead is a showerhead electrode which energizes the process gas passing therethrough into a plasma state. The method can comprise etching a layer on the semiconductor substrate by supplying RF power to the showerhead electrode such that the process gas forms a plasma in contact with an exposed surface of the semiconductor substrate. For example, the semiconductor substrate can comprise a silicon or gallium arsenide wafer and the method can include dry etching a dielectric, semiconductive or conductive layer of material on the wafer. Alternatively, the method can include depositing a layer of material on the semiconductor substrate. In the case where the showerhead comprises a showerhead electrode attached to a temperature-controlled member, the method can include withdrawing heat from the showerhead electrode by passing coolant through the temperature-controlled member. In the case of etching, openings can be etched through exposed portions of a dielectric layer of the substrate to an electrically conductive or semiconductive layer of the substrate. For example, the etching step can be carried out as part of a process of manufacturing a damascene structure. Further, the method can include replacing an aluminum baffle plate of a gas distribution system with the silicon containing baffle plate.

BRIEF DESCRIPTION OF THE DRAWINGS

The objects and advantages of the invention will be understood by reading the following detailed description in conjunction with the drawings in which.

DETAILED DESCRIPTION OF THE PREFERRED EMBODIMENTS

Figure 1:
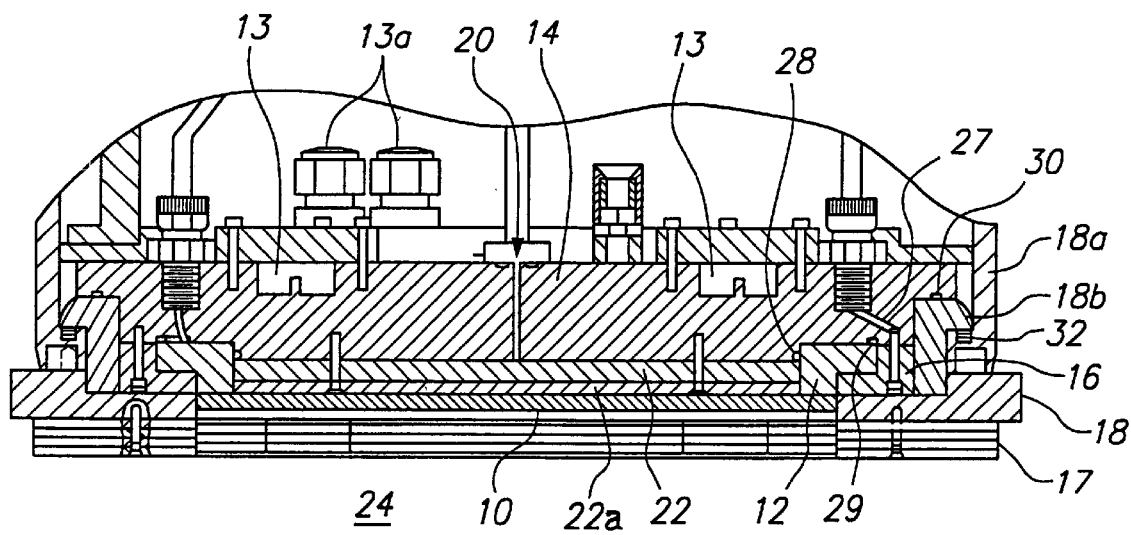
FIG. 1 is a side sectional view of a showerhead electrode assembly for single wafer processing in accordance with the invention.

For a better understanding of the invention, the following detailed description refers to the accompanying drawings, wherein preferred exemplary embodiments of the present invention are illustrated and described. In addition, the reference numbers used to identify like elements in the drawings are the same throughout.

According to the present invention, contamination of semiconductor substrates can be substantially reduced during processing in a plasma reaction chamber which includes a showerhead for distributing process gas. An example of such a plasma processing system is a parallel plate type reactor wherein an individual semiconductor wafer is supported on a bottom electrode and the upper electrode comprises a showerhead electrode. During processing in such reactors, plasma attacks the showerhead electrode and other interior parts of the reactor. In a parallel plate reactor wherein the plasma is confined in a narrow zone defined by a wafer on an electrostatic chuck ("ESC") having a silicon edge ring, a silicon showerhead electrode and a stacked array of quartz confinement rings, it has surprisingly been found that the aluminum baffle plate adjacent the showerhead electrode is attacked by the plasma to a sufficient extent to cause metal and particle contamination of the wafer.

In a typical showerhead having a baffle plate arrangement, process gas enters a plenum and passes through one or more baffle plates prior to exiting through the showerhead. In a plasma processing chamber utilizing such an arrangement, it has been discovered that plasma attacks the baffle plate adjacent the showerhead in the vicinity of the holes in the showerhead. Over time, an erosion pattern (identical to the hole pattern in the showerhead) develops on the underside of the baffle plate with the result that aluminum enters the interior of the plasma and forms a difficult to remove polymer. For instance, in the case of an oxide etch chamber wherein the process gas contains fluorine, the aluminum combines with the fluorine to form an AlF-containing polymer. With increasing aluminum in the polymer, the polymer becomes more dense leading to dust particles and flakes in the etch chamber. Such particles are referred to as "adders" when they are found on processed wafers. Because such adders can cause defective integrated circuits, it is desirable to minimize the number of adders on a processed wafer. Further, in order to obtain high production efficiency, it is desirable to maximize the time between when a plasma reactor must be subjected to a "wet clean" to restore process reproducibility. That is, while it is common to conduct a plasma cleaning step during each wafer process cycle, after a certain number of wafers are processed the build-up of byproducts in the reactor leads to process drift outside the process window. During such wet cleaning, it is necessary to shut down production and chemically clean the inside of the chamber.

According to the invention, it has surprisingly been discovered that (1) the number of particles which cause device failures or adversely impact yield of the processed wafers can be significantly reduced, (2) contamination by aluminum can be reduced by at least an order of magnitude, preferably at least 2 orders of magnitude, and/or (3) the time between wet cleans necessary for repeatable wafer processing can be extended by at least 100%, preferably by 200% or more, e.g. from 4000 rf minutes (as in the case of an aluminum baffle plate) to 12,000 or more rf minutes ("rf minutes" refers to the total length of time that the wafers are processed by plasma in the reactor before the next wet cleaning of the reactor). Such highly beneficial results can be obtained by utilizing a silicon containing baffle plate adjacent the showerhead. The showerhead arrangement can be used in any type of semiconductor processing apparatus wherein it is desired to distribute process gas over a semiconductor substrate. Such apparatus includes CVD systems, ashers, capacitive coupled plasma reactors, inductive coupled plasma reactors, ECR reactors, and the like.

In accordance with a preferred embodiment of the invention, the silicon containing baffle plate is incorporated in a showerhead electrode 10 of a single wafer etcher, as shown in FIG. 1. Such a showerhead electrode 10 is typically used with an electrostatic chuck having a flat bottom electrode on which a wafer is supported spaced 1 to 2 cm below the electrode 10. Such chucking arrangements provide temperature control of the wafer by supplying backside He pressure which controls the rate of heat transfer between the wafer and the chuck.

The showerhead electrode assembly shown in FIG. 1 is a consumable part which must be replaced periodically. Because the electrode assembly is attached to a temperature-controlled member, for ease of replacement, the upper surface of the outer edge of the silicon electrode 10 can be bonded to a graphite support ring 12 with indium which has a melting point of about 156° C. However, the electrode can be attached by other techniques, such as by an elastomeric joint, explained below in connection with FIGS. 2 and 3.

The electrode 10 shown in FIG. 1 is a planar disk having uniform thickness from center to edge thereof and an outer flange on ring 12 is clamped by an aluminum clamping ring 16 to an aluminum temperature-controlled member 14 having water cooling channels 13. Water is circulated in the cooling channels 13 by water inlet/outlet connections 13a. A plasma confinement ring 17 comprised of a stack of spaced-apart quartz rings surrounds the outer periphery of electrode 10. The plasma confinement ring 17 is bolted to a dielectric (e.g., quartz) annular ring 18 which in turn is bolted to a dielectric housing 18a. The purpose and function of confinement ring 17 is to cause a pressure differential in the reactor and increase the electrical resistance between the reaction chamber walls and the plasma thereby confining the plasma between the upper and lower electrodes. A radially inwardly extending flange of clamping ring 16 engages the outer flange of graphite support ring 12. Thus, no clamping pressure is applied directly against the exposed surface of electrode 10.

Process gas from a gas supply is supplied to electrode 10 through a central hole 20 in the temperature-controlled member 14. The gas then is distributed through one or more vertically spaced apart baffle plates 22 and passes through gas distribution holes (not shown) in the electrode 10 to evenly disperse the process gas into reaction chamber 24. In order to provide enhanced heat conduction from electrode 10 to temperature-controlled member 14, process gas can be supplied to fill open spaces between opposed surfaces of temperature-controlled member 14 and support ring 12. In addition, gas passage 27 connected to a gas passage (not shown) in the annular ring 18 or confinement ring 17 allows pressure to be monitored in the reaction chamber 24. To maintain process gas under pressure between temperature-controlled member 14 and support ring 12, a first O-ring seal 28 is provided between an inner surface of support ring 12 and an opposed surface of temperature-controlled member 14 and a second O-ring seal 29 is provided between an outer part of an upper surface of support ring 12 and an opposed surface of member 14. In order to maintain the vacuum environment in chamber 24, additional O-rings 30, 32 are provided between temperature-controlled member 14 and cylindrical member 18b and between cylindrical member 18b and housing 18a.

In accordance with the invention, the lower baffle 22a is made of and/or coated with silicon or a silicon compound such as silicon carbide. The silicon can comprise single crystal or polycrystalline silicon of high purity such as 99.999% or above. The silicon carbide can be a high purity commercially produced silicon carbide such as CVD silicon carbide material available from manufacturers such as Morton International, Inc. of Woburn, Mass., Sanzo Metal, Inc. of Tamani, Japan, NGK Insulator, Ltd. of Nagoya, Japan, or sintered silicon carbide materials available from Cercom, Inc., of Vista, Calif., Carborundum, Inc., of Costa Mesa, Calif. and Ceradyne, Inc. of Costa Mesa, Calif. Silicon carbide produced by graphite conversion using silicon vapor is available from Poco Graphite, Inc. of Decatur, Tex.

In addition to silicon and silicon carbide, other suitable but less preferred aluminum-free materials which may or may not be incorporated in the lower baffle plate and/or other parts of the gas distribution system include non-oxide ceramics such as silicon nitride, boron carbide, boron nitride, etc., oxide materials such as quartz, silicon oxide, etc., thermoplastics such as "VESPEL", "PEEK", "TEFLON", etc., and high purity graphite. However, in a showerhead electrode used for etching, baffle plates made of non-electrically conductive material can lead to subtle differences in rf characteristics of the etch tool whereas baffle plates made of graphite are aggressively attacked by oxygen plasmas used in dielectric etch processes leading to particle problems and high wear of the graphite. In contrast, sputtering of silicon and silicon carbide baffle plates by the plasma produces silicon or silicon and carbon, both of which are abundantly present on the wafer being processed and in the etch gases. Further, silicon and silicon carbide exhibit good wear characteristics in such a plasma environment.

According to a preferred embodiment of the invention, the lower baffle plate can be made of a highly pure silicon carbide, e.g., at least about 99.999% pure. An especially preferred silicon carbide from a cost perspective is a non-sintered form of silicon carbide made by graphite conversion wherein a shaped piece of graphite is reacted with silicon vapor at temperatures such as 1600° C. to convert the graphite to silicon carbide. The starting graphite is preferably a fine particle, low porosity high purity graphite. As a result of the conversion to silicon carbide by the silicon vapor, the bulk silicon carbide can have a porosity ranging from 10 to 30%, e.g., around 20%. If desired, the silicon carbide can be coated with a layer of CVD SiC. The SiC prepared in this manner exhibits thermal conductivity on the order of about 80 W/m·k at room temperature, compressive strength of at least about 80,000 psi, fracture toughness of at least about 2.10 MPa-m$^{-2}$, and tensile strength of at least about 15,000 psi.

The silicon or silicon carbide baffle plate can be designed as a drop-in replacement for existing aluminum baffle plates or as a part of any gas distribution system wherein it is desired to reduce contamination attributable to that particular part. For example, the silicon containing baffle plate can be used as a drop-in replacement for the aluminum baffle plate of an Exelan® or 4520XLE®, both of which are manufactured by the assignee of the present application, LAM Research Corporation.

The silicon containing baffle according to the invention provides reduced particle contamination, reduced metal contamination and increased production efficiency due to the increase in time between wet cleans. Such improvements appear possible because silicon and silicon carbide are more resistant and less contaminating than an aluminum baffle plate. That is, since the lower baffle is directly behind the showerhead electrode, a line-of-sight exists between it and the plasma via the holes in the showerhead electrode. Ions generated in the plasma are accelerated through the showerhead holes towards the baffle, causing the baffle surface to be sputtered. As a result, the plasma chamber is contaminated with aluminum and other trace metals contained in the standard aluminum baffle plate. Once the chamber is coated with the aluminum, the aluminum combines with the polymer generated during the plasma etching process, creating a dusty or flaky polymer that can be deposited on a wafer in the chamber. Such particle defects reduce the yield of the wafer. The silicon and silicon carbide (SiC) baffle plates according to the invention outperformed baffle plates made of aluminum (Al), graphite, pyrolytic graphite, SiC coated graphite, Vespel®, and quartz in one or more of the categories set forth in the following table.

| Property | Electrical | Contaminates | Physical | Particles |
| --- | --- | --- | --- | --- |
| SiC | good | best | good | best |
| Al | best | worst | best | poor |
| Graphite | good | good | marginal | poor |
| Pyrolytic Graphite | good | good | marginal | poor |
| SiC Coated Graphite | good | good | good | poor |

-continued

| Property | Electrical | Contaminates | Physical | Particles |
|---|---|---|---|---|
| Vespel ® | poor | good | poor | good |
| Silicon | marginal | good | marginal | unknown |
| Quartz | poor | good | poor | unknown |

In a comparison of an aluminum baffle plate to a silicon containing baffle plate, wafers etched in a plasma chamber having a showerhead electrode with a silicon containing baffle plate exhibited on average one-half or less "adders" (i.e., particles) compared to the same process reactors using an aluminum baffle. Further, in comparing the time between wet cleans used to restore process repeatability measured in rf minutes, the plasma etch reactor with the silicon containing baffle plate did not require wet cleaning for 15,000 rf minutes or even 25,000 rf to over 29,000 rf minutes compared to only 4000 rf minutes for the aluminum baffle plate. Such dramatic improvement in production efficiency makes the silicon containing baffle plate a highly economical replacement part for existing aluminum baffle plates.

Because the electrode assembly is a consumable part, it is desirable to use non-contaminating materials for the parts of the electrode assembly which are contacted by the plasma. Depending on the process gas chemistry, such materials are preferably aluminum-free conductive, semiconductive or insulating materials including glass, ceramic and/or polymer materials such as single crystal or polycrystalline silicon, quartz, carbides of silicon, boron, titanium, tantalum, niobium and/or zirconium, nitrides of silicon, boron, titanium, tantalum and/or zirconium, oxides of silicon, boron, titanium, tantalum, niobium and/or zirconium, suicides of titanium, tungsten, tantalum and/or cobalt, pyrolytic graphite, diamond, etc. Materials made of silicon, carbon, nitrogen and/or oxygen are most preferred for surfaces in a plasma reaction chamber.

The electrode preferably consists of an electrically conductive material such as a planar silicon (e.g., single crystal silicon), graphite or silicon carbide electrode disc having uniform thickness from the center to the outer edge thereof. However, electrodes having nonuniform thickness, different materials and/or without process gas distribution holes could also be used with the electrode assembly according to the invention. In a preferred embodiment, the electrode is a showerhead electrode provided with a plurality of spaced apart gas discharge passages which are of a size and distribution suitable for supplying a process gas which is energized by the electrode and forms a plasma in the reaction chamber beneath the electrode.

Figure 2:
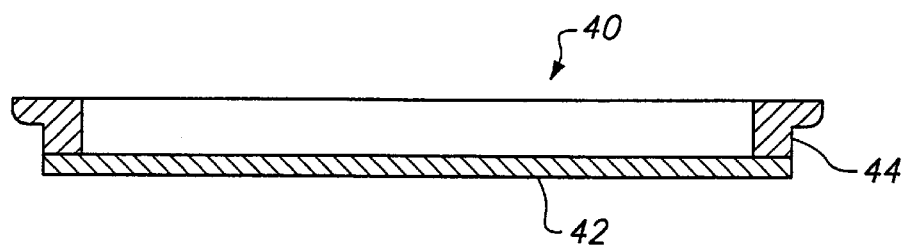
FIG. 2 is a side sectional view of an elastomer bonded showerhead electrode assembly according to an embodiment of the invention.
Figure 3:
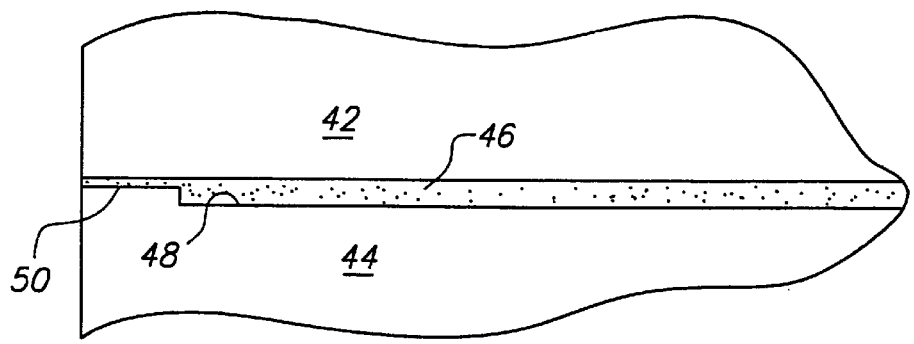
FIG. 3 is a side sectional view of a portion of the arrangement shown in FIG. 2.

FIG. 2 shows a showerhead electrode arrangement 40 which can be substituted for the electrode assembly constituted by electrode 10 and support ring 12 shown in FIG. 1. The electrode 40 differs from the In-bonded assembly shown in FIG. 1 in that electrode 42 is bonded to support ring 44 by an elastomeric joint 46 which can be located in a recess 48, as shown in FIG. 3. The recess 48 extends continuously around the support ring 44 between an inner wall (not shown) and an outer wall 50 of the support ring 44. Each wall 50 can be as thin as possible, e.g. about 30 mils wide, which allows the elastomer to form a thin layer (e.g. about 2 $\mu$m thick in the case where the elastomer includes 0.7 to 2 $\mu$m sized filler) in the area in contact with each wall 50 and a thicker layer (e.g. about 0.0025 inch) in the recess 48. The recess formed by the walls can be extremely shallow, e.g. about 2 mils deep, which provides a very thin elastomeric joint having enough strength to adhesively bond the electrode to the support ring yet allow movement of the electrode relative to the support ring during temperature cycling of the electrode assembly. Additionally, the walls of the recess can protect the elastomeric joint from attack by the plasma environment in the reactor.

The electrode assembly dimensions can be adapted to meet the demands of the intended use of the electrode assembly. As an example, if the electrode is used to process an 8 inch wafer, the electrode can have a diameter slightly less than 9 inches and the support ring can have a width at the interface between the electrode and the support ring slightly less than 0.5 inch. For example, the support ring at the interface can have an inner diameter of 8 inches and an outer diameter at the interface of 8.8 inches. In such a case, the interface between the electrode and support ring can have a width of about 0.4 inch and the recess can have a width of 0.34 inch if the walls are 0.030 inch wide.

The elastomeric joint can comprise any suitable elastomeric material such as a polymer material compatible with a vacuum environment and resistant to thermal degradation at high temperatures such as above 200° C. The elastomer material can optionally include a filler of electrically and/or thermally conductive particles or other shaped filler such as wire mesh, woven or non-woven conductive fabric, etc. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber. Examples of high purity elastomeric materials include one-component room temperature curing adhesives available from General Electric as RTV 133 and RTV 167, a one-component flowable heat-curable (e.g., over 100° C.) adhesive available from General Electric as TSE 3221, and a two-part addition cure elastomer available from Dow Corning as "SILASTIC." An especially preferred elastomer is a polydimethylsiloxane containing elastomer such as a catalyst cured, e.g. Pt-cured, elastomer available from Rhodia as V217, an elastomer stable at temperatures of 250° C. and higher.

In the case where the elastomer is an electrically conductive elastomer, the electrically conductive filler material can comprise particles of a an electrically conductive metal or metal alloy. A preferred metal for use in the impurity sensitive environment of a plasma reaction chamber is an aluminum alloy such as a 5–20 weight % silicon containing aluminum base alloy. For example, the aluminum alloy can include about 15 wt % silicon. However, in order to reduce the possibility for contamination from aluminum, it may be desirable to use aluminum-free electrically conductive filler such as silicon powder or silicon carbide powder. Details of the elastomeric joint can be found in commonly-owned U.S. patent application Ser. No. 09/107,471 filed Jun. 30, 1998, the entire disclosure of which is hereby incorporated by reference.

The silicon containing baffle plate can be used for various plasma processes including plasma etching of various dielectric layers such as doped silicon oxide such as fluorinated silicon oxide (FSG), undoped silicon oxide such as silicon dioxide, spin-on-glass (SOG), silicate glasses such as boron phosphate silicate glass (BPSG) and phosphate silicate glass (PSG), doped or undoped thermally grown silicon oxide, doped or undoped TEOS deposited silicon oxide, etc. The dielectric dopants include boron, phosphorus and/or arsenic. The dielectric can overlie a conductive or semiconductive layer such as polycrystalline silicon, metals such as aluminum, copper, titanium, tungsten, molybdenum or alloys thereof, nitrides such as titanium nitride, metal suicides such as titanium silicide, cobalt silicide, tungsten silicide, molybdenum silicide, etc. For instance, the gas distribution system according to the invention can be used for plasma etching a damascene structure.

The plasma can be a high density plasma produced in various types of plasma reactors. Such plasma reactors typically have high energy sources which use RF energy, microwave energy, magnetic fields, etc. to produce the high density plasma. For instance, the high density plasma could be produced in a transformer coupled plasma (TCP™) which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,723, the disclosure of which is hereby incorporated by reference.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents which fall within the range of the claims are intended to be embraced therein.

What is claimed is:

1. A silicon containing baffle plate which reduces particle and/or metal contamination during processing of a semiconductor substrate, the baffle plate being adapted to fit within the baffle chamber of a showerhead gas distribution system, the baffle plate comprising silicon on at least one surface thereof and being adapted to fit within the baffle chamber such that the silicon containing surface is adjacent to and facing the showerhead.

2. The baffle plate of claim 1, wherein the silicon containing baffle plate consists essentially of silicon or silicon carbide having a purity of at least 99.999%.

3. The baffle plate of claim 1, wherein the silicon containing baffle plate is comprised entirely of single crystal silicon, polycrystalline silicon, non-sintered silicon carbide, sintered silicon carbide, bulk CVD silicon carbide, sintered silicon carbide with a CVD coating of silicon carbide, graphite coated with silicon carbide, reaction synthesized silicon carbide, or combination thereof.

4. The baffle plate of claim 1, wherein the silicon containing baffle plate includes openings therethrough for passage of process gas, the openings being offset from openings in the showerhead when the silicon containing baffle plate is mounted in the baffle chamber.

5. The baffle plate of claim 1, wherein the silicon containing baffle plate is a drop-in replacement for a lower aluminum baffle plate in a baffle chamber having three aluminum baffle plates.

6. The baffle plate of claim 1, wherein the silicon containing baffle plate is comprised entirely of a non-sintered silicon carbide material.

7. The baffle plate of claim 6, wherein the non-sintered silicon carbide material consists essentially of silicon carbide formed by reaction synthesis of silicon vapor with a carbon material.

8. A method of processing a semiconductor wafer in a plasma processing chamber including a gas distribution system, comprising replacing a lower baffle plate of the gas distribution system with the silicon containing baffle plate according to claim 1.

9. A plasma processing chamber including the silicon containing baffle of claim 1 as part of a gas distribution system, the gas distribution system including an elastomer bonded showerhead electrode of silicon and a baffle chamber, the silicon containing baffle plate being mounted in the baffle chamber with the silicon containing surface facing the showerhead electrode, the silicon containing baffle plate being effective to reduce metal contamination by an order of magnitude during plasma processing of a semiconductor substrate in the chamber compared to metal contamination produced under the same processing conditions but using an aluminum baffle plate in place of the silicon containing baffle plate.

10. The plasma processing chamber of claim 9, further comprising a semiconductor wafer supported on an electrostatic chuck having a silicon edge ring and a plasma confinement ring comprised of a stacked array of quartz rings.

11. A method of reducing particle and/or metal contamination during processing of a substrate in a reaction chamber wherein a gas distribution system includes a showerhead, a baffle chamber through which process gas passes to the showerhead, and a silicon containing baffle plate according to claim 1 located in the baffle chamber, the method comprising:

supplying a semiconductor substrate to the reaction chamber;

supplying process gas into the baffle chamber, the process gas passing through the silicon containing baffle plate into a space between the silicon containing baffle plate and the showerhead followed by passing through the showerhead and into an interior of the reaction chamber; and processing the semiconductor substrate with the process gas passing through the showerhead.

12. The method of claim 11, wherein the semiconductor substrate comprises a silicon or gallium arsenide wafer and the method includes dry etching a dielectric, semiconductive or conductive layer of material on the wafer.

13. The method of claim 11, wherein the method includes depositing a layer of material on the semiconductor substrate.

14. The method of claim 11, wherein the showerhead comprises a showerhead electrode elastomer bonded to a temperature-controlled member, the method including withdrawing heat from the showerhead electrode by passing coolant through the temperature-controlled member.

15. The method of claim 11, wherein aluminum baffle plates are located in the baffle chamber between the silicon containing baffle plate and a gas inlet supplying the process gas to the baffle chamber, the process gas passing through the aluminum baffle plates prior to passing through the silicon containing baffle plate.

16. The method of claim 11, wherein the process gas passes through openings in the silicon containing baffle plate which are offset from openings in the showerhead, the offset being sufficient to prevent a line-of-sight between the plasma in the chamber and the openings in the silicon containing baffle plate.

17. The method of claim 11, wherein the semiconductor substrate comprises a wafer supported on an electrostatic chuck having a silicon edge ring, the showerhead electrode is made of silicon and energizes the process gas into a plasma which is confined within a plasma confinement ring comprising a stacked array of quartz rings.

18. The method of claim 17, further comprising etching a layer on the semiconductor substrate by supplying RF power to the showerhead electrode such that the process gas forms a plasma in contact with an exposed surface of the semiconductor substrate.

19. The process of claim 11, wherein openings are etched through exposed portions of a dielectric layer of the substrate to an electrically conductive or semiconductive layer of the substrate.

20. The process of claim 19, wherein the etching step is carried out as part of a process of manufacturing a damascene structure.

* * * * *